United States Patent
Kurapov et al.

(10) Patent No.: US 12,110,580 B2
(45) Date of Patent: Oct. 8, 2024

(54) TiCN HAVING REDUCED GROWTH DEFECTS BY MEANS OF HiPIMS

(71) Applicant: Oerlikon Surface Solutions AG, Pfäffikon, Pfäffikon (CH)

(72) Inventors: Denis Kurapov, Walenstadt (CH); Siegfried Krassnitzer, Feldkirch (AT)

(73) Assignee: Oerlikon Surface Solutions AG, Pfaffikon, Pfaffikon (CH)

( * ) Notice: Subject to any disclaimer, the term of this patent is extended or adjusted under 35 U.S.C. 154(b) by 25 days.

(21) Appl. No.: 18/148,197

(22) Filed: Dec. 29, 2022

(65) Prior Publication Data
US 2023/0135238 A1 May 4, 2023

Related U.S. Application Data

(62) Division of application No. 16/095,369, filed as application No. PCT/EP2017/000500 on Apr. 21, 2017, now Pat. No. 11,542,587.

(60) Provisional application No. 62/326,098, filed on Apr. 22, 2016.

(51) Int. Cl.
C23C 14/00 (2006.01)
C23C 14/02 (2006.01)
C23C 14/06 (2006.01)
C23C 14/34 (2006.01)
C23C 14/35 (2006.01)
H01J 37/34 (2006.01)

(52) U.S. Cl.
CPC ........ *C23C 14/0057* (2013.01); *C23C 14/024* (2013.01); *C23C 14/0664* (2013.01); *C23C 14/345* (2013.01); *C23C 14/3485* (2013.01); *C23C 14/352* (2013.01); *H01J 37/3426* (2013.01); *H01J 37/3467* (2013.01)

(58) Field of Classification Search
None
See application file for complete search history.

(56) References Cited

U.S. PATENT DOCUMENTS

| | | |
|---|---|---|
| 6,372,303 B1 | 4/2002 | Burger et al. |
| 6,383,624 B1 | 5/2002 | Soderberg et al. |
| 9,540,726 B2 | 1/2017 | Krassnitzer |
| 10,612,132 B2 | 4/2020 | Bolz et al. |
| 11,060,181 B2 | 7/2021 | Krassnitzer |
| 11,542,587 B2 | 1/2023 | Kurapov et al. |
| 2007/0284255 A1 | 12/2007 | Gorokhovsky et al. |
| 2010/0183900 A1 | 7/2010 | Wallin et al. |
| 2011/0011737 A1 | 1/2011 | Wu et al. |
| 2011/0308941 A1 | 12/2011 | Krassnitzer et al. |
| 2013/0056348 A1 | 3/2013 | Papa et al. |
| 2014/0248100 A1 | 9/2014 | Krassnitzer |
| 2015/0037710 A1 | 2/2015 | Cooke et al. |
| 2016/0369386 A1* | 12/2016 | Krassnitzer ......... H01J 37/3429 |
| 2018/0347034 A1 | 12/2018 | Bolz et al. |

FOREIGN PATENT DOCUMENTS

| | | | |
|---|---|---|---|
| DE | 102008021912 A1 * | 11/2009 | ......... C23C 14/0605 |
| EP | 2565291 A1 | 3/2013 | |
| EP | 2829635 A1 | 1/2015 | |
| JP | 2010-142932 A | 7/2010 | |
| JP | 2010-529295 A | 8/2010 | |
| KR | 10-2010-0083545 | 7/2010 | |
| KR | 10-2013-0093188 | 8/2013 | |
| WO | 2007089216 A1 | 8/2007 | |
| WO | 2014207154 A1 | 12/2014 | |
| WO | 2017089597 A1 | 6/2017 | |

OTHER PUBLICATIONS

Jensen et al. "A study of film growth and tribological characterization of nanostructured C-N/TiNx multilayer coatings". Surface and Coatings Technology 94-95 (1997) 174-178 (Year: 1997).*
Bipolar. (2007). In R. E. Allen (Ed.), The penguin English Dictionary (3rd ed.). Penguin. Credo Reference: https://search.credoreference.com/content/entry/pengui neng/bipolar/0?institution Id= 7 43 (Year: 2007).

* cited by examiner

*Primary Examiner* — Jose I Hernandez-Kenney
(74) *Attorney, Agent, or Firm* — Polson Intellectual Property Law P.C.; Margaret Polson; Christopher Sylvain

(57) ABSTRACT

A method for applying a coating having at least one TiCN layer to a surface of a substrate to be coated by means of high power impulse magnetron sputtering (HIPIMS), wherein, to deposit the at least one TiCN layer, at least one Ti target is used as the Ti source for producing the TiCN layer, said target being sputtered in a reactive atmosphere by means of a HIPIMS process in a coating chamber, wherein the reactive atmosphere comprises at least one inert gas, preferably argon, and at least nitrogen gas as the reactive gas, wherein:
the reactive atmosphere additionally contains, as a second reactive gas, a gas containing carbon, preferably CH4, used as the source of carbon to produce the TiCN layer wherein, while depositing the TiCN layer, a bipolar bias voltage is applied to the substrate to be coated, or
at least one graphite target is used as the source of carbon for producing the TiCN layer, said target being used for sputtering in the coating chamber using a HIPIMS process with the reactive atmosphere having only nitrogen gas as the reactive gas, wherein the Ti targets are preferably operated by means of a first power supply device or a first power supply unit and the graphite targets are operated with pulsed power by means of a second power supply device or a second power supply unit.

13 Claims, 2 Drawing Sheets

Figures 3, 4:
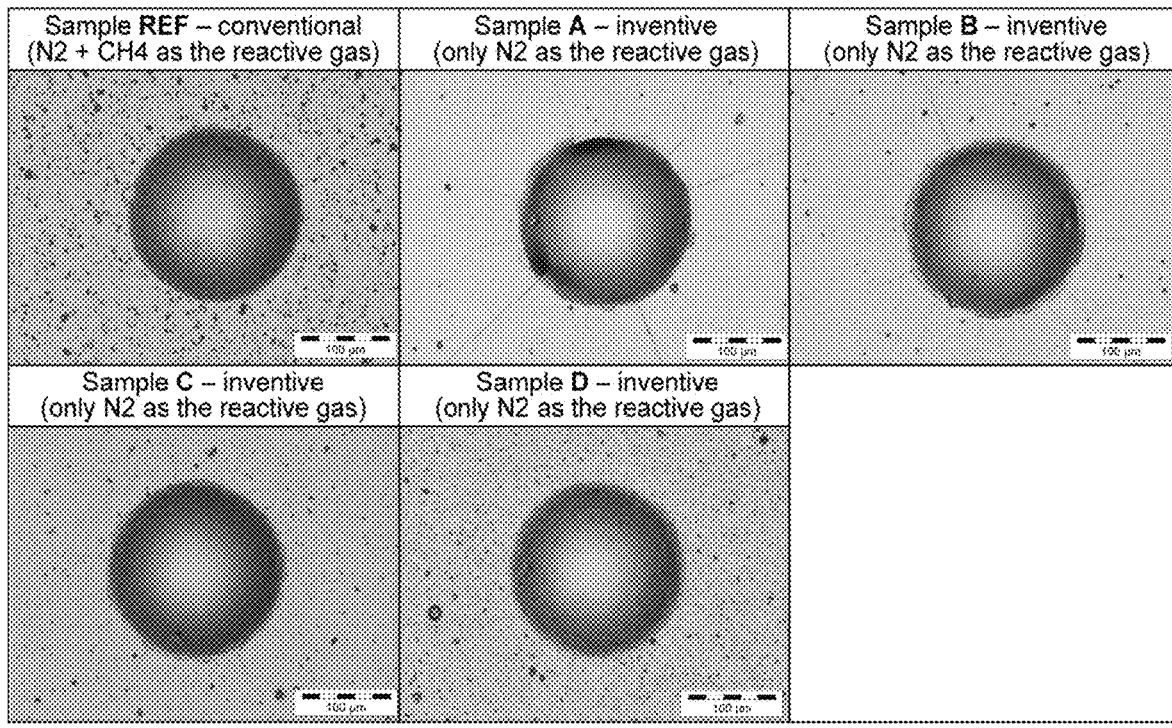

FIG. 1
| Sample No. | HIT [GPa] | | Modulus of elasticity [GPa] | | Ra [µm] | Rz [µm] | Rmax [µm] | Stress [GPa] | Carbon [at%] ±2 at% | Bias [V] |
|---|---|---|---|---|---|---|---|---|---|---|
| A | 34.5 | ±2.0 | 400 | ±20 | 0.05 | 1.66 | 2.23 | 4.4 | 11.01 | -40 DC |
| B | 35.9 | ±1.3 | 405 | ±10 | 0.05 | 1.12 | 2.03 | 4.4 | 10.72 | -40 DC |
| C | 36.3 | ±2.1 | 405 | ±14 | 0.02 | 0.24 | 0.4 | 3.5 | 9.41 | -50 BP |
| D | 37.2 | ±1.6 | 394 | ±12 | 0.02 | 0.23 | 0.36 | 4.1 | 10.06 | -80 BP |
| E | 37.5 | ±1.6 | 392 | ±10 | 0.06 | 1.05 | _ | 4.4 | 10.39 | -100 BP |
FIG. 2
| Sample No. B – 40 VDC bias | Sample No. C – 50 V pulsed bias |
|---|---|
| 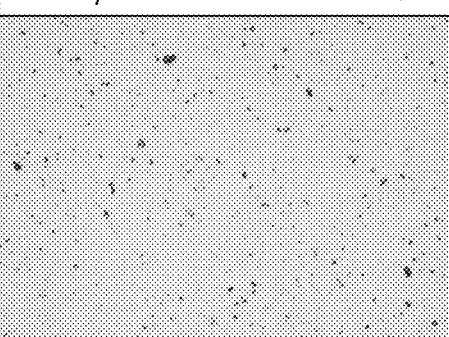 | 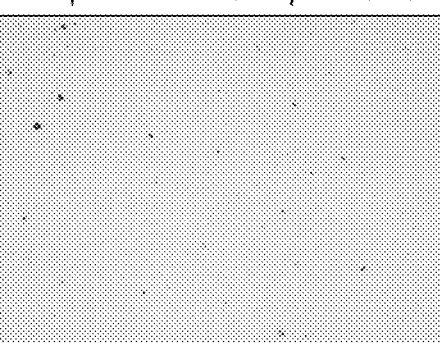 |
| Sample No. D – 80 V pulsed bias | Sample No. E – 100 V pulsed bias |
| 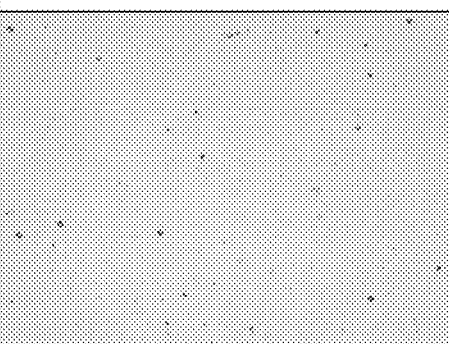 | 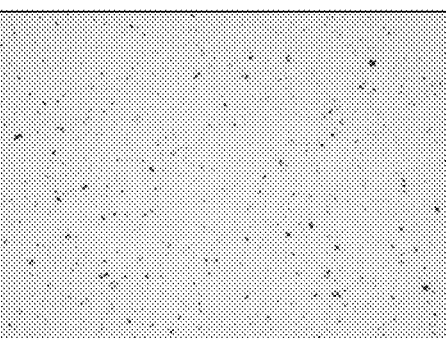 |

| Sample No. | HIT [GPa] | | Modulus of elasticity [GPa] | | Ra [μm] | Rz [μm] | Rmax [μm] | Stress [GPa] | Carbon [at%] ±2 at% | Bias [V] |
|---|---|---|---|---|---|---|---|---|---|---|
| REF | 36.1 | ±1.8 | 394 | ±13 | 0.035 | 0.075 | 1.555 | 4.2 | 10.98 | -50 |
| A | 33.6 | ±1.55 | 408 | ±13 | 0.04 | 0.085 | 1.61 | 3.9 | 2.6 | -50 |
| B | 36.65 | ±2.55 | 408 | ±18 | 0.03 | 0.055 | 0.99 | 4.3 | 6.1 | -50 |
| C | 39.35 | ±1.85 | 394 | ±16 | 0.035 | 0.07 | 1.545 | 4.8 | 10.8 | -50 |
| D | 34.75 | ±1.95 | 302 | ±15 | 0.05 | 0.085 | 1.81 | 3.5 | 18.9 | -50 |
| E | 40.35 | ±1.85 | 402 | ±16 | 0.085 | 0.16 | 2.245 | 2.8 | 20.5 | -50 |

TiCN HAVING REDUCED GROWTH DEFECTS BY MEANS OF HiPIMS

The invention relates to a method for applying a TiCN coating with reduced growth defects to surfaces, in particular the surfaces of workpieces, components or tools.

PRIOR ART

When coating using reactive sputter or high power impulse magnetron sputtering (HiPIMS) processes, a metallic target is often used as the source of the vapor deposition material and at least one reactive gas is used in addition to the process gas. Within the scope of the present invention, the terms "vapor deposition" and "sputtering" are considered identical. That component of a sputter source from which material is stripped during the process is designated the target within the scope of the present invention.

For depositing layers using reactive sputter processes or also using cathodic arc deposition, two reactive gases are usually needed. According to prior art, these are usually nitrogen and a gas containing carbon, usually acetylene ($C_2H_2$). While arc deposition can be considered a relatively robust process, regulating the process gas plays a crucial role for process stability, in particular for the sputter or HiPIMS processes.

Krassnitzer discloses, in WO2014207154 for example, a method for depositing TiCN layers using HiPIMS wherein sputtering is used on Ti targets in a reactive atmosphere containing $N_2$ and $C_2H_2$ to apply TiCN layers to substrate surfaces. The HiPIMS process uses power pulses and/or power pulse sequences with an energy content referenced to the target area of at least 0.2 joules/$cm^2$ per power pulse or power pulse sequence. It is proposed to control the concentration of the reactive gases in the coating chamber by regulating or controlling the reactive gas flows and to control various properties such as the color impression by means of the concentration of the reactive gases in the coating chamber.

It is known that, during the sputter or HiPIMS process, the two reactive gases react with the vaporized target material and form a metal-ceramic layer on the substrate. To densify the layer, a negative bias voltage is applied to the substrate to accelerate the positively charged ions to the substrate.

It is also known that, to set optimum layer properties in a repeatable manner, precise knowledge and control of a sputter or HiPIMS process is extremely important. In this respect, the choice of the optimum operating point can be considered especially crucial because even a slight deviation from this operating point during the process can lead to fluctuations in the layer quality, changed color properties, process instability and finally to a process breakdown. The term operating point here designates a specific ratio of the process gas to the one or plurality of reactive gases.

To keep a selected operating point constant during the process, a gas flow or partial pressure control system is usually used. This means, with only one reactive gas, for example, when depositing TiN, an Ar partial pressure of 0.40 Pa and an $N_2$ partial pressure of 0.03 Pa are set, resulting in a total pressure of 0.43 Pa. In a HiPIMS process, the operating point can be very dependent on the selected process conditions such as the averaged pulse power, $P_{av}$, or the pulse duration, $t_{pulse}$, but also on the state and age of the target used or the pump power. The set operating point, the $N_2$ partial pressure or the total pressure resulting from this is usually achieved by changing the flow of $N_2$.

However, if two or a plurality of reactive gases such as $N_2$ and $C_2H_2$ are used at the same time, this concept can no longer be applied because the pressure of only one reactive gas can be controlled and the other reactive gas is usually admitted into the chamber at a fixed flow rate.

For the reasons cited above, it can be seen that slight changes to the process parameters result in a deviation from the desired operating point, a situation that can, in turn, have a negative impact on the desired layer quality.

The problems cited above play a decisive role, in particular during the reactive deposition of TiCN wherein the two elements of carbon and nitrogen are stripped from the gas phase and react with the titanium sputtered from the titanium target to form TiCN. Even slight deviations of the optimum operating point can cause considerable deviations of the layer properties.

Another critical aspect of reactive sputter or HiPIMS processes is the reaction of one or a plurality of reactive gases with the target surface, which usually forms ceramic reaction products. In general, this process is known as target poisoning and can have considerable effects on the sputter characteristic or the operating point of a process. If poorly conducting or even insulating compounds form on the target surface during target poisoning, this may lead to a drastic increase of the discharge voltage and, in the worst case, cause a collapse of the sputter plasma if the entire target surface is covered.

In EP2565291A1, it is proposed to avoid the phenomenon of target poisoning when using reactive sputter processes with different target materials in that a gas flow controller is attached to the sputter source, said controller setting the flow of reactive gas depending on the magnitude of the poisoning on the corresponding sputter target, this determination being made by measuring the source voltage and, according to a preset target value, allowing control of the flow of reactive gas. However, this method is relatively expensive to implement and requires detailed knowledge of the processes at the target in conjunction with the reactive gases. In addition, it is not possible to select a desired operating point using the ratio of the process gas to the reactive gas.

As a result, it is of primary importance to have a method wherein, depending on the desired layer properties, it is also possible to select any operating point necessary for this and to operate this process in a stable manner. The present invention enables precisely this step.

To densify the layer, a negative bias voltage is applied to the substrate to accelerate the positively charged ions to the substrate. When depositing layers using a reactive sputter or HiPIMS process with a direct current (DC) bias voltage, the voltage used should be greater than the plasma potential. Usually, a DC bias voltage greater than −30 V, thus −40 V for example, is applied to accelerate the ions to the substrate material.

By increasing the DC bias voltage from −40 V to −80 V, for example, an increase in ion energy is achieved and this manifests itself in a greater density of the layer and, usually, in an increase in the internal stresses of the layer. Often, an increase in the layer hardness can also be observed with an increase in the internal stress.

However, while great hardness is desired in many applications, increasing the internal stresses at the same time may result in considerable difficulties in achieving the desired layer thickness of a few micrometers at the desired location of the component or the tool. Internal stresses in the layer that are too high result in layer spalling at points or even over wide areas.

In conventional sputter or HiPIMS processes, the layer growth incorporates growth defects.

When producing TiCN using conventional sputter or HiPIMS processes, growth defects are incorporated during layer growth and these defects can, for example, come from metallic particles of the target that are not completely covered by the vapor deposition or even from impurities in the system. In addition, it is difficult to differentiate where exactly the vapor deposited target material reacts with the reactive gas(es) meaning that TiCN that has undergone a complete reaction already may be present on the target surface of a titanium target, this material is then vapor deposited as "microparticles" and can be incorporated as a growth defect in the layer growing on the substrate. This process of reaction by the reactive gases with the target material on the target surface is normally known as "poisoning" and is highly dependent on the process parameters and, in this case in particular, on the control of the reactive gas flow. A target is considered completely poisoned once the target surface has been totally covered by one or a plurality of reaction products.

In addition, a high surface quality of the layer on the substrate often depends on the layer thickness because even smaller growth defects during layer growth result in a considerable increase in the roughness of the coated component or tool. This means that thicker layers tend to exhibit greater roughness than would be the case for a thinner layer with the same deposition conditions.

Object of the Present Invention

The object of the present invention is to provide a method enabling the production of TiCN layers with fewer growth defects but, at the same time, leading to no loss of layer hardness or no increase in the internal stresses of the layer if at all possible.

It is desirable that the inventive method exhibits a high process stability.

Means of Attaining the Object by the Present Invention

The object of the present invention is attained by providing a method according to claim 1.

According to the invention, a coating having at least one TiCN layer is applied to a surface of a substrate to be coated by means of HiPIMS, wherein, to deposit the at least one TiCN layer, at least one target containing Ti, for example, a Ti target, is used as the Ti source for producing the TiCN layer, said target being sputtered in a reactive atmosphere by means of a HiPIMS process in a coating chamber, wherein, to reduce growth defects during the deposition of the at least one TiCN layer, the reactive atmosphere comprises one inert gas, preferably argon, and at least nitrogen gas as the reactive gas and wherein, to reduce growth defects during deposition of the at least one TiCN layer, the reactive atmosphere additionally contains, as a second reactive gas, a gas containing carbon, preferable $CH_4$, used as the source of carbon to produce the TiCN layer wherein, while depositing the TiCN layer, a bipolar bias voltage is applied to the substrate to be coated, or at least one target containing carbon, for example, a graphite target, is used as the source of carbon for producing the TiCN layer, said target being used for sputtering in the coating chamber using a HiPIMS process with the reactive atmosphere having only nitrogen gas as the reactive gas, wherein the targets containing Ti, are operated preferably by means of a first power supply device or a first power supply unit and the targets containing graphite are operated with pulsed power preferably by means of a second power supply device or a second power supply unit.

DESCRIPTION OF THE INVENTION

The inventors have found that it is surprisingly possible to produce layers of hard material made of TiCN with a very high hardness and, at the same time, a very smooth layer surface with relatively low internal stresses by means of reactive HiPIMS processes if a bipolar bias voltage is used during the HiPIMS process. The inventors have also found that it is surprisingly possible to produce layers of hard TiCN material with a very high hardness and, at the same time, a very smooth layer surface by means of reactive HiPIMS processes if only nitrogen is used as the reactive gas in the HiPIMS process and the carbon for producing TiCN is provided by a target containing carbon.

In this way, it is possible to grow thicker layers and to overcome the problems cited above, for example, in the application area, to produce a sufficiently thick layer with high surface quality, thus low roughness.

To deposit the TiCN layers according to the invention, a HiPIMS method was used that applies very high power pulses or power pulse sequences to the target surface of one or a plurality of titanium targets. During the pulse duration, $t_{pulse}$, of a power pulse or during a sequence duration, $t_{pulsesequence}$, of a power pulse sequence, energy is introduced into the target surface by means of positively charged Ar ions that knock loose or vaporize target material. In a HiPIMS method, the amount of ionized vapor deposition material is considerably greater than in the conventional sputter method. The energy content in the HiPIMS process can be achieved very simply by setting an appropriately high pulse power, P, and/or an appropriately very long pulse length or pulse duration, $t_{pulse}$.

Standard HiPIMS configurations and coating parameters are known from prior art.

Within the scope of the present invention, such HiPIMS methods as, for example, described by Krassnitzer in WO2012143091A1, in particular, were used.

The invention is completed in detail in the following and using figures and tables with examples.

FIG. 1: Table with an overview of the properties of sample deposited TiCN layers that were deposited using a bipolar bias voltage according to Example 1 (see C, D, E) compared to TiCN layers that were deposited using a DC voltage according to prior art (see A, B)

FIG. 2: Light-microscope pictures of TiCN layer surfaces according to Example 1 using different bias voltages FIG. 3: Table with an overview of the properties of sample deposited TiCN layers that were deposited using Ti and graphite targets according to Example 2 (see A, B, C, D, E) compared to TiCN layers that were deposited using only Ti targets and a DC voltage according to prior art (see REF))

FIG. 4: Light-microscope pictures of TiCN layer surfaces according to Example 2 using different target or reactive gas configurations.

EXAMPLE 1 (ACCORDING TO A FIRST PREFERRED EMBODIMENT)

All TiCN layers shown as examples for this first Example were produced with a thin TiN layer as the undercoat. First, the TiN undercoat was deposited on the surface to be coated using the following parameters: a pulse power, $P_{pulse}$, of 60 kW, an average power on the target, $P_{av}$, of 9.0 kW with a $t_{pulse}$ of 25 ms, at a total pressure, $p_{tot}$, of 0.81 Pa, with an $N_2$ partial pressure of 0.01 Pa, an Ar partial pressure of 0.4 Pa and a constant bias voltage of −80 V at a coating temperature of 450° C.

The TiCN layers were then applied immediately afterward with the same $P_{pulse}$, the same $P_{av}$, the same $N_2$ partial pressure and Ar partial pressure but with an additionally constant $CH_4$ flow of 50 sccm and a shorter $t_{pulse}$ of 1 ms.

For the comparison examples A and B in the table of FIG. 1, there was a DC bias voltage both during deposition of the TiN undercoat and during the deposition of the TiCN layer.

For the Examples C, D and E of the invention in Table 1 of FIG. 1, the bias voltage according to the invention was changed after the deposition of the TiN undercoat to bipolar pulsed operation for the deposition of the TiCN layers according to the invention. All layers had a layer thickness of about 4.0 μm and were then characterized as can be seen in the summary of layer properties in Table 1. The sample numbers A and B were deposited under identical conditions but in different batches with a constant DC bias voltage of −40 V. The sample numbers C, D and E were deposited using a bipolar pulsed voltage of −50 V, −80 V and −100 V, respectively. The duty cycle $t_{neg}:t_{pos}$ of the negative bias voltage to the positive bias voltage was kept constant at 50:25 ms for the samples C, D and E.

Surprisingly, a considerable reduction in the roughness factors Ra, Rz and Rmax was found using pulsed bias voltage according to the invention instead of a DC bias voltage when the bias voltage was comparable and even higher. FIG. 2 shows light-microscope pictures of the coated sample surfaces with sample B (constant −40 V-DC) being compared to the samples C, D and E. The optical impression of the black spots is produced by growth defects that disturb the otherwise very smooth surface structure under incident light. A lower density of black spots can clearly be seen in the samples C to E compared to sample B, something that agrees well with the measured roughness values. Interestingly, however, the measured carbon content of the layers, within the specified measuring accuracy, is independent of the method used to apply the bias voltage and was roughly constant at 10±2 at %.

Surprisingly, considerably lower internal stress values were measured for the TiCN layers using pulsed bias voltage than for the comparison samples using DC bias voltage. As seen in Table 1, the internal stress level of −4.4 GPa that occurred when using −40 V of DC bias voltage was not reached until the pulsed bias voltage was −100 V.

Furthermore, a moderate increase in the hardness was seen with the pulsed bias voltage, a situation that is becoming more desirable for the application.

Preferably, a bias voltage in the range of −20 V to −200 V is used.

Preferably, the duty cycle $t_{neg}:t_{pos}$ of the negative bias voltage to the positive bias voltage is in a range from 10:1 to 1:5, preferred in 5:1 to 1:2 and particularly preferred in 2:1 to 1:1.

The bias voltage level can be set such that it is symmetrical or asymmetrical. In the case of asymmetrical operation, it is possible to set the ion current and the electron current independent of one another.

Preferably, acetylene ($C_2H_2$) or methane ($CH_4$) is used as the gas containing carbon.

According to another embodiment of the invention, ceramic TiC targets or targets made of Ti and TiC can be used in place of metallic titanium targets when depositing TiCN layers.

EXAMPLE 2 (ACCORDING TO A SECOND PREFERRED EMBODIMENT)

All TiCN layers shown as examples for this second Example were produced with a thin TiN layer as the undercoat. First, the TiN undercoat was deposited on the surface to be coated using the following parameters: a pulse power, $P_{pulse}$, of 60 kW, an average power on the target, $P_{av}$, of 9.0 kW with a $t_{pulse}$ of 25 ms, at a total pressure, $p_{tot}$, of 0.81 Pa, with an $N_2$ partial pressure of 0.01 Pa, an Ar partial pressure of 0.4 Pa and a constant bias voltage of −80 V at a coating temperature of 450° C.

During this, three titanium targets were operated in the manner specified above.

The TiCN layers (A, B, C, D, E in the table of FIG. 3) were deposited in accordance with the invention immediately afterward wherein the three titanium targets were operated as before with the same settings but, in addition, three carbon targets were added.

The three carbon targets were used for deposition in different sample processes with $P_{pulse}$ of 60 kW, a constant bias voltage of −50 V, but different $t_{pulse}$ values of 0.05, 0.1, 0.2, and 0.3 ms, respectively, with the resulting $P_{av}$ of 0.4, 0.9, 1.8, and 2.8 kW, respectively. The associated samples are listed in the sequence as A, B, C and D, and the properties are specified in FIG. 3.

As the reference sample (REF), a conventionally deposited TiCN layer was produced, again with the same TiN undercoat as described above wherein, however, only titanium targets were used for the TiCN layer and Ar was used as the process gas at a partial pressure of 0.40 Pa, $N_2$ was used as the first reactive gas at a partial pressure of 0.01 Pa and additionally $CH_4$ was used as the second reactive gas at 50 sccm, corresponding to a total pressure $p_{tot}$ of 0.47 Pa. A DC bias voltage was used both for deposition of the TiN undercoat and for deposition of the TiCN layer. These settings for the reference sample correspond to prior art as mentioned above in the introduction and serve for comparison purposes with regard to layer properties and process stability.

A process with the TiN undercoat described above but using to process gases and two types of targets for the TiCN layer was used for the additional comparison sample E. In this case, the parameters for the three titanium targets were held constant as described above and the settings for the three carbon targets were comparable to those used for sample C, each with $P_{pulse}$ of 60 kW, a constant bias voltage of −50 V, $t_{pulse}$ of 0.2 ms, and the resulting $P_{av}$ of 1.8 kW, an Ar partial pressure of 0.4 Pa, an $N_2$ partial pressure of 0.03 and a fixed $CH_4$ flow of 10 sccm were used for deposition.

All layers shown as examples had a layer thickness of about 4.0 μm and were then characterized as can be seen in the summary of layer properties in Table 1 of FIG. 1.

FIG. 4 shows light-microscope pictures of the coated sample surfaces with sample REF being compared to the samples A, B, C and D. The optical impression of the black spots is produced by growth defects that disturb the otherwise very smooth surface structure under incident light. Surprisingly, the samples A to D exhibit a lower density of black spots in comparison to sample REF, something that agrees well with the measured roughness values. The amount of carbon increases with increasing power at the target.

Interestingly, however, it was found that, when comparing samples REF and C, they both have roughly the same carbon content but a considerably higher layer hardness was measured for sample C with the deposition performed in accordance with the invention. This means that using two target materials, one being titanium and the second, in this example, being carbon, has a positive effect on the layer properties and, in addition, permits a stable process.

The comparison sample E that used the two different target materials of titanium and carbon, and $N_2$ and $CH_4$ as the reactive gases, exhibits a considerably higher surface roughness, a fact that, however, in comparison to the linear correlation of carbon content or roughness of the samples A, B, C and D that used the deposition process of the invention, may have something to do with the high carbon content in sample E.

Within the scope of the invention, it is conceivable that a fine adjustment of the carbon content can be achieved by using targets made of a compound material containing carbon. This could be a compound, for example, that consists of one or a plurality of metals and one or a plurality of carbides, for example, a target made of TiC or Ti+TiC.

It is just as conceivable that other metals such as Cr, Zr, Ta or Nb be used for the method according to the invention.

Preferably, a bias voltage in the range of −20 V to −200 V, a total pressure ranging from $10^{-4}$ mbar (0.02 Pa) to $10^{-2}$ mbar (2 Pa), a power density in the range of 0.1 kw/cm$^2$ to 3.0 kW/cm$^2$ and/or an average power $P_{av}$ in the range of 0.05 to 10 kW are used. The partial pressure ratio of Ar to $N_2$ can vary within the range of 0.01 to 0.95.

Preferably, acetylene ($C_2H_2$) or methane ($CH_4$) is used as the gas containing carbon.

According to another embodiment of the invention, ceramic TiC targets or targets made of Ti and TiC can be used in place of metallic titanium targets when depositing TiCN layers.

Specifically, the present invention discloses a method of applying a coating having at least one TiCN layer to a surface of a substrate to be coated by means of HiPIMS, wherein, to deposit the at least one TiCN layer, at least one target containing Ti is used as the Ti source for producing the TiCN layer, said target being sputtered in a reactive atmosphere by means of a HiPIMS process in a coating chamber, wherein, to reduce growth defects during the deposition of the at least one TiCN layer, the reactive atmosphere comprises one inert gas, preferably argon, and at least nitrogen gas as the reactive gas, wherein, to reduce growth defects during deposition of the at least one TiCN layer, the reactive atmosphere additionally contains, as a second reactive gas, a gas containing carbon used as the source of carbon to produce the TiCN layer wherein, while depositing the TiCN layer, a bipolar bias voltage is applied to the substrate to be coated, or at least one target containing carbon is used as the source of carbon for producing the TiCN layer, said target being used for sputtering in the coating chamber using a HiPIMS process with the reactive atmosphere having only nitrogen gas as the reactive gas.

Preferably, the method can be executed such that, if a gas containing carbon is used as the source of carbon, the gas containing carbon comprises $CH_4$ or is made of $CH_4$, or comprises $C_2H_2$ or is made of $C_2H_2$.

Preferably, the method can be executed such that, if one target containing carbon is used as the source of carbon, one or a plurality of targets containing Ti are operated by means of a first power supply device or a first power supply unit and one or a plurality of targets containing carbon are operated with pulsed power by means of a second power supply device or a second power supply unit.

In accordance with one preferred version of the methods described above, one or a plurality of targets containing Ti are metallic targets made of Ti.

In accordance with another preferred version of the methods described above, one or a plurality of targets containing Ti are ceramic targets made of TiC.

In accordance with another preferred version of the method described above in which at least one target containing carbon is used, one or a plurality of targets containing carbon are made of graphite.

In accordance with another preferred version of the method described above in which at least one target containing carbon is used, one or a plurality of targets containing carbon are made of a compound material wherein the compound material, for example, comprises a metal or a plurality of metals and a carbide or a plurality of carbides.

The invention claimed is:

1. A method for depositing a coating having at least one titanium carbonitride (TiCN) layer on a surface of a substrate by means of high power impulse magnetron sputtering (HiPIMS), wherein, to reduce growth defects during deposition of the at least one TiCN layer on the surface, the method comprises:

depositing the TiCN layer with a HiPIMS process by sputtering at least one target comprising Ti and at least one target comprising carbon in a reactive atmosphere in a coating chamber, wherein the at least one target comprising Ti is used as the source of Ti for producing the TiCN layer, wherein the at least one target comprising carbon is used as the source of carbon for producing the TiCN layer, and wherein the reactive atmosphere has an inert gas and only nitrogen gas as a reactive gas.

2. The method of claim 1, wherein the at least one target comprising Ti is operated via a first power supply device or a first power supply unit, and/or the at least one target comprising carbon is operated with pulsed power via a second power supply device or a second power supply unit.

3. The method of claim 2, wherein the at least one target comprising Ti is a metallic target consisting of Ti.

4. The method of claim 3, wherein the at least one target comprising carbon is a target consisting of graphite.

5. The method of claim 3, wherein the at least one target comprising carbon is a target made of a composite material.

6. The method of claim 5, wherein the target made of the composite material consists of one carbide and at least one metal.

7. The method of claim 2, wherein the at least one target comprising Ti is a ceramic target consisting of TiC.

8. The method of claim 7, wherein the at least one target comprising carbon is a target consisting of graphite.

9. The method of claim 7, wherein the at least one target comprising carbon is a target made of a composite material.

10. The method of claim 9, wherein the target made of the composite material consists of one carbide and at least one metal.

11. The method of claim 2, wherein the at least one target comprising carbon is a target consisting of graphite.

12. The method of claim 2, wherein the at least one target comprising carbon is a target made of a composite material.

13. The method of claim 12, wherein the target made of the composite material consists of one carbide and at least one metal.

\* \* \* \* \*